(12) United States Patent
Sanghani et al.

(10) Patent No.: US 9,885,753 B2
(45) Date of Patent: Feb. 6, 2018

(54) SCAN SYSTEMS AND METHODS

(71) Applicant: Nvidia Corporation, Santa Clara, CA (US)

(72) Inventors: Amit Sanghani, San Jose, CA (US); Farideh Golshan, Santa Clara, CA (US); Venkata Kottapalli, Fremont, CA (US); Milind Sonawane, Syracuse, CA (US); Ketan Kulkarni, San Jose, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 14/050,242

(22) Filed: Oct. 9, 2013

(65) Prior Publication Data
US 2015/0100840 A1    Apr. 9, 2015

(51) Int. Cl.
*G01R 31/3185* (2006.01)
*G01R 31/3177* (2006.01)

(52) U.S. Cl.
CPC . *G01R 31/318586* (2013.01); *G01R 31/3177* (2013.01)

(58) Field of Classification Search
CPC .... G01R 31/318558; G01R 31/318525; G01R 31/318536; G01R 31/318586
See application file for complete search history.

(56) References Cited

U.S. PATENT DOCUMENTS

| | | | | |
|---|---|---|---|---|
| 5,043,986 A | * | 8/1991 | Agrawal | G01R 31/318586 714/731 |
| 5,627,841 A | * | 5/1997 | Nakamura | 714/731 |
| 5,680,406 A | * | 10/1997 | Nakamura | 714/724 |
| 5,691,990 A | * | 11/1997 | Kapur | G01R 31/318586 714/30 |
| 5,708,773 A | * | 1/1998 | Jeppesen et al. | 714/30 |

(Continued)

FOREIGN PATENT DOCUMENTS

| TW | 558640 | 10/2003 |
|---|---|---|
| TW | 200931045 | 7/2009 |

OTHER PUBLICATIONS

Rick Folea, Got the BGA Blues? Learn How to Obtain Visibility into the Pins of a Ball Grid Array Package Using Boundary Scan and the Universal Scan Debugging Tool, Xilinx Xcell Magazine, 2003, p. 1-4.

*Primary Examiner* — Steve Nguyen

(57) ABSTRACT

Efficient scan system presented can comprise: an array including a plurality of array non scannable components and a plurality of array quasi-scannable components wherein each column of the array includes at least one of the plurality of array quasi-scannable components; and an input interface configured to receive and selectively forward data and scan information to at least a portion of the array. At least a portion of the plurality of array quasi-scannable components can form a diagonal pattern in the array. The input interface can include: an input interface selection component wherein an output of the input interface selection component is communicatively coupled to an input of the input interface quasi-scannable component associated with one row and an input of the input interface selection component is communicatively coupled to an output of one of the plurality of array quasi-scannable components associated with another row.

18 Claims, 7 Drawing Sheets

(56) References Cited

U.S. PATENT DOCUMENTS

| | | | |
|---|---|---|---|
| 5,838,693 A * | 11/1998 | Morley | 714/726 |
| 5,909,453 A * | 6/1999 | Kelem | G01R 31/318558 365/201 |
| 6,189,128 B1 * | 2/2001 | Asaka | 716/103 |
| 6,446,230 B1 * | 9/2002 | Chung | 714/726 |
| 6,728,915 B2 * | 4/2004 | Whetsel | 714/727 |
| 7,406,640 B2 * | 7/2008 | Bushard et al. | 714/726 |
| 7,752,004 B1 * | 7/2010 | Gajendran et al. | 702/117 |
| 2005/0166108 A1 * | 7/2005 | Huisman | G01R 31/318536 714/726 |
| 2006/0026472 A1 * | 2/2006 | Adkisson et al. | 714/726 |
| 2006/0179373 A1 * | 8/2006 | Ishikawa | 714/727 |
| 2007/0234159 A1 | 10/2007 | Bushard et al. | |
| 2012/0278671 A1 | 11/2012 | Goel | |
| 2014/0068362 A1 * | 3/2014 | Goel | 714/727 |

\* cited by examiner

300

---

310
Forming an array input interface.

---

320
Forming an array and communicatively coupling the array to the array input interface.

---

330
Forming an array output interface and communicatively coupling the array output interface to the array.

510
Performing a scan configuration process.

520
Communicating scan information to an array.

530
Performing an information capture process including capturing information to and from at least one of the plurality of quasi scannable components.

540
Forwarding information captured in block 530.

FIG 5

SCAN SYSTEMS AND METHODS

FIELD OF THE INVENTION

The present invention relates to scan systems and methods. In particular, the present invention relates to array scan systems and methods.

BACKGROUND OF THE INVENTION

Electronic systems and devices have made a significant contribution towards the advancement of modern society and are utilized in a number of applications to achieve advantageous results. Numerous electronic technologies such as digital computers, calculators, audio devices, video equipment, and telephone systems have facilitated increased productivity and reduced costs in analyzing and communicating data in most areas of business, science, education and entertainment. These electronic systems typically include various components and scan testing the system components is often important for ensuring proper testing and debug. However, adding scan testing capabilities to a system can be complicated and also have undesirable impacts.

Some conventional systems include arrays of components. An array can be designed to include a structured data path. The data paths often have regular structures and are generally used for transporting data like wide busses. Data path blocks can be built with regular rows and columns of various components (e.g., flops, latches, adders, etc). Placement of the data paths is typically important and placement can impact the design or layout (e.g., the layout can become large, etc.). However, traditional array approaches that include structured data paths usually have some characteristics that present challenges for scan testing (e.g., challenges related to ATPG tools, diagnosibility, etc.). Traditional attempts at addressing these challenges are often problematic.

While scan testability typically has a variety of benefits it can also often have associated potential undesirable impacts. Adding scan testability can have detrimental impacts on timing and typically increases the size of the circuitry. There is usually a trade off between adding scan testability and the undesirable impacts. Leaving out or limiting scan test components typically leads to reduced ability to detect faults. In some conventional array data paths, a majority of undetected faults are due to the control portion (e.g., decoder for the write addresses, clock gates, clock lines, etc.). Some conventional arrays also include non scannable cells or elements (e.g., non scannable storage elements, non scannable latches, etc.) that also contribute to undetected faults.

SUMMARY

Presented systems and methods can facilitate efficient and effective scan operations. In one embodiment, a system and method includes a quasi-scannable or pseudo scannable component. In one embodiment, a discrete quasi-scannable or pseudo scannable component is not scannable individually or discretely by itself but is selectively configured with other components to form a constructed scan component and participate in scan operations (e.g., forms an element or part of a scannable component, can participate in part of or element of a scan operation, etc.). In one embodiment, a system and method includes an array of state components and at least some of the state components can be quasi-scannable components. In one exemplary implementation, the array includes a diagonal pattern of state components that are scannable or quasi-scannable components. The quasi-scannable components can include a variety of components (e.g. state elements, latches, etc.). It is appreciated that quasi-scannable components can efficiently and flexibly participate in a variety of functions or operations (e.g., regular or normal data operations, scan operations, controllability, observability, and fault detection, etc.).

In one embodiment, a system comprises an input interface and an array. The input interface includes at least one multiplexer and at least one quasi-scannable second phase latch. The array includes a plurality of non-scannable first phase latches and quasi-scannable first phase latches. The non-scannable first phase latches and quasi-scannable first phase latches are similar in that they are individually or discretely non-scannable, however the quasi-scannable latches can be selectively configured or combined with other components to form a constructed scannable component. In one embodiment, a selectively constructed scannable component includes at least one multiplexer, at least one quasi-scannable second phase latch and at least one quasi-scannable first phase latch. The constructed scannable component can collectively form a scan flop included in a scan path. In one exemplary implementation, a scannable communication path is formed including a diagonal pattern of at least some of the plurality of quasi-scannable first phase components. In one exemplary implementation, a quasi-scannable second phase latch drives a quasi-scannable first phase latch included in the formation of the constructed scannable component. In one embodiment, each column of the array includes at least one of the plurality array quasi-scannable components. In one embodiment, a constructed scannable component is associated with each row of an array.

In one embodiment, an input interface is configured to receive and selectively forward data and scan information to at least a portion of the array. In one exemplary implementation, an input interface multiplexer component forwards information to an input interface quasi-scannable component which can drive the array quasi-scannable component and together the components form a constructed scannable component. In one embodiment, an output of an input interface multiplexer is communicatively coupled to an input of an input interface quasi-scannable second phase latch associated with one row of an array; and an input of the input interface multiplexer is communicatively coupled to an output of at least one array quasi-scannable first phase latch associated with another row of the array.

The system can also include a clocking component that is coupled to and clocks the plurality of quasi-scannable first phase latches and the plurality of non scannable first phase latches included in the array. The clocking component can include a clock gate element that clocks (e.g., a clock signal, etc.) at least one of the plurality of quasi-scannable first phase latches included in a column; and a control decoder that decodes information and selectively forwards an enable to the clock gate element.

DESCRIPTION OF THE DRAWINGS

The accompanying drawings, which are incorporated in and form a part of this specification, illustrate embodiments of the invention by way of example and not by way of limitation. The drawings referred to in this specification should be understood as not being drawn to scale except if specifically noted.

FIG. 3 is a block flow chart of an exemplary array scan formation method in accordance with one embodiment of the present invention.

FIG. 5 is a block diagram of an exemplary scan method in accordance with one embodiment of the present invention.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and control component under analysis have not been described in detail as not to unnecessarily obscure aspects of the present invention.

Presented systems and methods can facilitate efficient scan testing of an array. In one embodiment, the array can include a plurality components for capturing scan information wherein the components are configured in a diagonal pattern. In one exemplary implementation, the components include constructed scannable components. The constructed scannable components can be selectively configured by combining or coupling quasi-scannable components with other components. In one exemplary implementation, a quasi-scannable component is a discrete component that is non scannable by itself but is selectively configured or coupled to other discrete components to form a constructed scannable component. The quasi-scannable component can be similar or the same as a non-scannable component. For example, both the quasi-scannable and non-scannable components can be discrete phase 1 latches. The difference is the quasi-scannable component can be combined with other components to perform scan operations.

In one embodiment, there is at least one quasi-scannable component in each column of the array. Each row of the array can also have at least one quasi-scannable component. In one embodiment, a system comprises an array including a plurality of non scannable state elements and a plurality of quasi-scannable state elements wherein each row of the array and each column of the array includes at least one of the plurality quasi-scannable state elements. In one exemplary implementation, the non scannable state components and quasi-scannable state components include latches. In one embodiment, at least some of the quasi-scannable components are configured or arranged in a diagonal pattern at least in part of an array. It is appreciated there are a variety of possible implementations.

Figure 1:
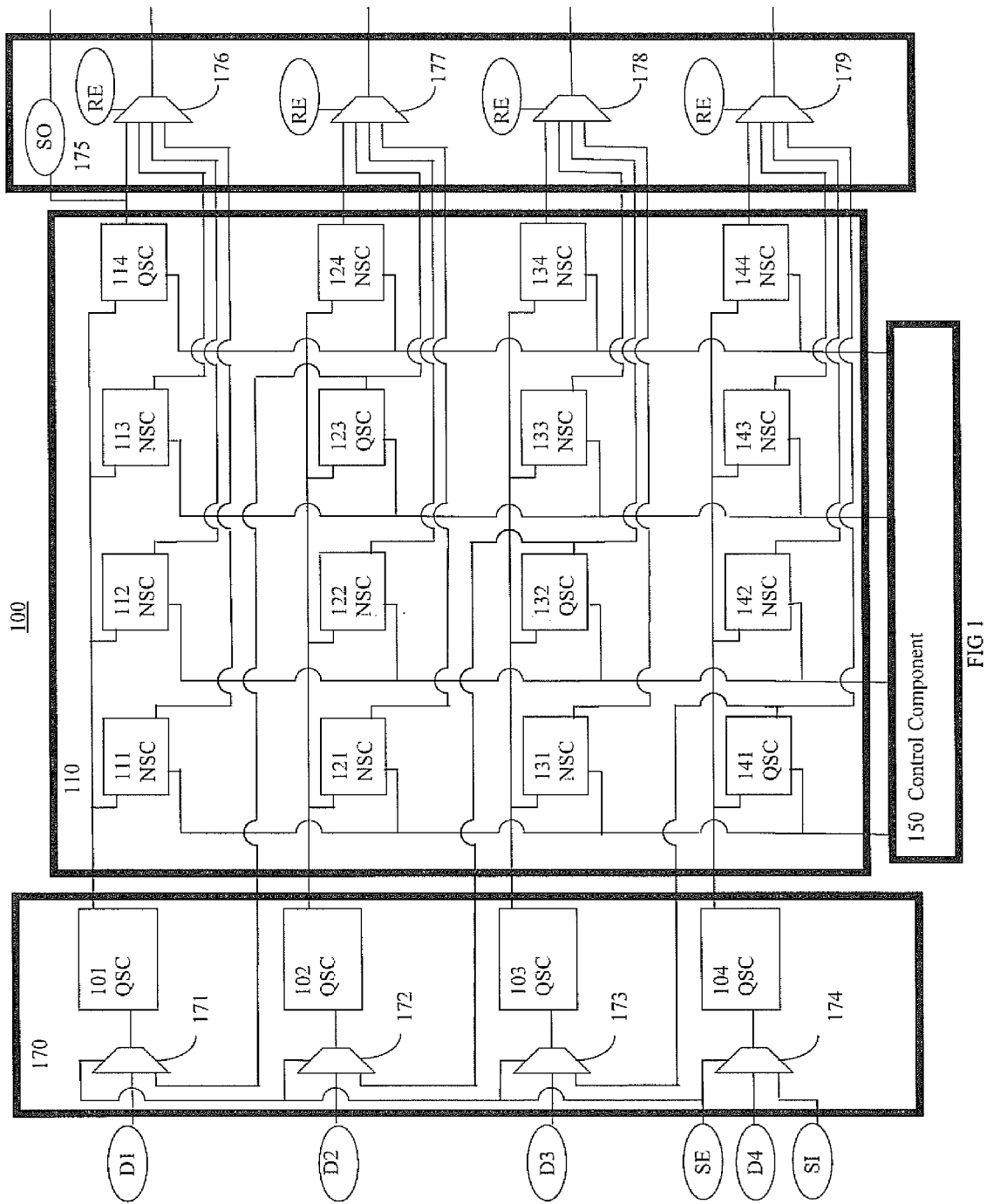
FIG. 1 is a block diagram of an exemplary scan system in accordance with one embodiment of the present invention.

FIG. 1 is a block diagram of exemplary scan system 100 in accordance with one embodiment of the present invention. Scan system 100 includes an array 110, control component 150, an array input interface 170 and an optional array output interface 175. Array 110 includes array quasi-scannable components 141, 132, 123, and 114, array non-scannable components 111-113, 121-122, 124, 131, 133-134 and 142-144. Input interface 170 includes input interface selection components 171-174 and input interface quasi-scannable components 101-104. Optional output interface 175 includes output interface read selection components 176-179. Constructed scannable components are selectively formed by coupling the otherwise non-scannable discrete elements together in a scan configuration and including them in a scan chain. A first constructed scannable component (CSC1) is selectively formed by discrete elements including MUX 174, quasi-scannable component 104 and quasi-scannable component 141. A second constructed scannable component (CSC2) is selectively formed by discrete elements including MUX 173, quasi-scannable component 103 and quasi-scannable component 132. A third constructed scannable component (CSC3) is selectively formed by discrete elements including MUX 172, quasi-scannable component 102 and quasi-scannable component 123. A fourth constructed scannable component (CSC4) is selectively formed by discrete elements including MUX 171, quasi-scannable component 101 and quasi-scannable component 114.

Each of the respective input interface selection components 171-174 is communicatively coupled to a respective data input (e.g., D1, D2, D3 and D4) and also a scan input (e.g., SI, scan inputs of information from other rows, etc.). The respective input interface selection components 171-174 are also communicatively coupled to input interface quasi-scannable components 101-104 respectively. The input interface scannable component 101 is communicatively coupled to array non-scannable components 111, 112, 113 and array quasi-scannable component 114. The input interface scannable component 102 is communicatively coupled to array non-scannable components 121, 122, 124 and array quasi-scannable component 123. The input interface scannable component 103 is communicatively coupled to array non-scannable components 131, 133, 134 and array quasi-scannable component 132. The input interface scannable component 104 is communicatively coupled to array non-scannable components 142, 143, 144 and array quasi-scannable component 141. Each of the array quasi-scannable components 141, 132, 123, and 114, and array non-scannable components 111-113, 121-122, 124, 131, 133-134, and 142-144 are coupled to control component 150.

In one embodiment scan system 100 includes optional output interface read selection components 176-179. Output interface read selection component 176 is communicatively coupled to non-scannable components 111, 112, 113 and quasi-scannable component 114. Output interface read selection component 177 is communicatively coupled to non-scannable components 121, 122, 124 and quasi-scannable component 123. Output interface read selection component 178 is communicatively coupled to non-scannable components 131, 133, 134 and quasi-scannable component 132. Output interface read selection component 179 is communicatively coupled to non-scannable components 142, 143, 144 and quasi-scannable component 141. It is appreciated that if the optional output interface 175 is not included in scan system 100, the outputs of the array scannable and array non scannable components can be communicatively coupled to other components (not shown).

It is appreciated that the quasi-scannable and non scannable components can include a variety of components. In one embodiment, input interface quasi-scannable components 101-104 are second phase quasi-scannable components and array quasi-scannable components 141, 132, 123, and 114 are first phase quasi-scannable components. In one exemplary implementation at least some of the quasi-scannable and non scannable components include latches. The first phase latches can include or be referred to as various types of latches (e.g., phase 1 latches, phase A latches, high phase, etc.) and second phase latches can include or be referred to as various types of latches (e.g., phase 2 latches, phase B latches, low phase latches, etc.). In one embodiment, the input interface selection components and output interface selection components include multiplexers.

In one embodiment, at least some of the components of scan system 100 are configured in an array. In one exemplary implementation the array includes rows and columns. A first row includes array non-scannable components 111, 112, 113 and array quasi-scannable component 114. A second row includes array non-scannable components 121, 122, 124 and array quasi-scannable component 123. A third row includes array non-scannable components 131, 133, 134 and array quasi-scannable component 132. A forth row includes array non-scannable components 142, 143, 144 and array quasi-scannable component 141. A first column includes array non-scannable components 111, 121, 131 and array quasi-scannable component 141. A second column includes array non-scannable components 112, 122, 142 and array quasi-scannable component 132. A third column includes array non-scannable components 113, 133, 143 and array quasi-scannable component 123. A forth column includes array non-scannable components 124, 134, 144 and array quasi-scannable component 114. In one embodiment, array quasi-scannable components 114, 123, 132 and 141 are configured in a diagonal pattern in the array. Again it is appreciated quasi-scannable component 114 is selectively included in constructed scan component SC1, quasi-scannable component 123 is selectively included in constructed scan component SC2, quasi-scannable component 132 is selectively included in constructed scan component SC3, and quasi-scannable component 141 is selectively included in constructed scan component SC4.

It is appreciated that the terms row and column are intended to convey a dimension or orientation in the array and is not necessarily limited to a horizontal or vertical orientation. In one embodiment, a row and column have a perpendicular dimension or orientation to one another. In one exemplary implementation, a row can have a horizontal dimension or orientation and a column can have a vertical orientation. In one exemplary implementation, a column can have a horizontal dimension or orientation and a row can have a vertical orientation.

It is appreciated that an array can include a variety of configurations. In one embodiment, the array input interface 170, array 110 and array output interface 175 are all considered included in an array. It is appreciated that in addition to the indication above of components included in rows and columns, other components can be included or associated with rows and columns of the array. The input interface selection component 171, input interface quasi-scannable component 101, and optional output interface read selection component 176 can be included or associated with row 1. Input interface selection component 171, input interface quasi-scannable component 101, and quasi-scannable component 114 can be selectively configured to form a constructed scannable component SC4 in row 1. The input interface selection component 172, input interface quasi-scannable component 102, and optional output interface output read selection component 177 can be included or associated with row 2. Input interface selection component 172, input interface quasi-scannable component 102, and quasi-scannable component 123 can be selectively configured to form a constructed scannable component SC3 in row 2. The input interface selection component 173, input interface quasi-scannable component 103, and output interface read selection component 178 can be included or associated with row 3. Input interface selection component 173, input interface quasi-scannable component 103, and quasi-scannable component 132 can be selectively configured to form a constructed scannable component SC2 in row 3. The input interface selection component 174, input interface quasi-scannable component 104, and output interface read selection component 179 can be included or associated with row 4. Input interface selection component 174, input interface quasi-scannable component 104, and quasi-scannable component 141 can be selectively configured to form a constructed scannable component SC1 in row 4.

The components of scan system 100 cooperatively operate to provide efficient and flexible operations (e.g., normal operations, scan testing, controllability, observability, fault detection, etc.). In one embodiment, some of the components of scan system 100 are included in a data path. The data path can be a structured data path. In one embodiment, input data is communicated through the structured data path. In one exemplary implementation, scan data can also be communicated through a portion of a structured data path.

In one embodiment, at least some of the quasi-scannable components form a diagonal pattern in the array. The quasi-scannable components can be selectively configured or included in constructed scannable components with diagonal capture points in the array. The respective input selection components select between respective input data and scan inputs. Some of the scan inputs are forwarded from outputs of other scannable components in the array. The output of array quasi-scannable component 141 is forwarded to an input of input interface selection component 173. The output of array quasi-scannable component 132 is forwarded to an input of input interface selection component 172. The output of array quasi-scannable component 123 is forwarded to an input of input interface selection component 171. In one embodiment, a scan chain output (e.g., Scan Out, SO, etc.) is forwarded outside of latch array (e.g., via an output of QSC 114.

The input interface selection components 171-174 select between respective scan input signals and data input signals. The outputs of input interface selection components 171-174 are forwarded to input interface quasi-scannable components 101-104 respectively. Input interface selection components 171-174 and quasi-scannable components 101-104 can be selectively configured to participate or be included in constructed scan components SC4, SC3, SC2, and SC1 respectively. The output of input interface quasi-scannable component 101 is forwarded to array non-scannable components 111, 112, 113 and array quasi-scannable component 114 where quasi-scannable component 114 can be selectively configured to participate or be included in constructed scannable component SC4. The output of input interface quasi-scannable component 102 is forwarded to array non-scannable components 121, 122, 124 and array scannable component 123 where quasi-scannable component 123 can be selectively configured to participate or be included in constructed scannable component SC3. The output of input interface quasi-scannable component 103 is forwarded to array non-scannable components 131, 133, 134 and array scannable component 132 where quasi-scannable component 132 can be selectively configured to participate or be included in constructed scannable component SC2. The output of input interface quasi-scannable component 104 is forwarded to array non-scannable components 142, 143, 144 and array quasi-scannable component 141 where quasi-scannable component 141 can be selectively configured to participate or be included in constructed scannable component SC1.

The outputs of the array quasi-scannable and array non-scannable components are forwarded to respective output interface selection components. The outputs of array non-scannable components 111, 112, 113 and array quasi-scannable component 114 are forwarded to output interface read selection component 176. The outputs of array non-scannable components 121, 122, 124 and array quasi-scannable component 123 are forwarded to output interface read selection component 177. The outputs of array non-scannable components 131, 133, 134 and array quasi-scannable component 132 are forwarded to output interface read selection component 178. The outputs of array non-scannable components 142, 143, 144 and array quasi-scannable component 141 are forwarded to output interface read selection component 179. It is appreciated that if the optional output interface read selection components 176-179 are not included the outputs of array the outputs of the array scannable and array non-scannable components can be forwarded to other components (not shown).

Control component 150 controls the communication of the information through the array. In one embodiment control component 150 controls the clocking of the information through the array. In one exemplary implementation, control component 150 controls the clocking of the information through the array based upon write address information.

It is appreciated that quasi-scannable components (e.g., 141, 132, 123, 114, etc.) can participate in a variety of functions or operations (e.g., regular or normal data operations, scan operations, controllability, observability, fault detection, etc.). In one exemplary implementation, quasi-scannable component 132 can participate in the latching and communication of regular or normal data from D3. The regular or normal data D3 can be communicated to quasi-scannable component 132 via multiplexer 173 and quasi-scannable component 103. Quasi-scannable component 132 can participate in the capture of scan input information from SI. The scan input information SI can be communicated to quasi-scannable component 132 via multiplexer 174, quasi-scannable component 104, quasi-scannable component 141, multiplexer 173 and quasi-scannable component 103. Quasi-scannable component 132 can participate in the capture of information associated with control component 150 operations. In one exemplary implementation, quasi-scannable component 132 can participate in capture of clock related information from control component 150. The captured information can be utilized in observability and fault detection.

It is appreciated that individually, discrete components (e.g., quasi-scannable, non scannable components, etc.) can be similar types of components (e.g., non scannable first phase latch, non scannable second phase latch, etc.). In one embodiment, individually discrete non scannable components are similar to quasi-scannable components. In one exemplary implementation, non scannable and quasi-scannable components are the same type of components. Non scannable components and quasi-scannable components can be phase 1 latches. In one embodiment of the present invention, while both a non scannable component and quasi-scannable component is not discretely scannable, the difference between a non scannable component and quasi-scannable component is the quasi-scannable component is scannable by selectively configuring or coupling the quasi-scannable component with other discrete components.

Figure 2:
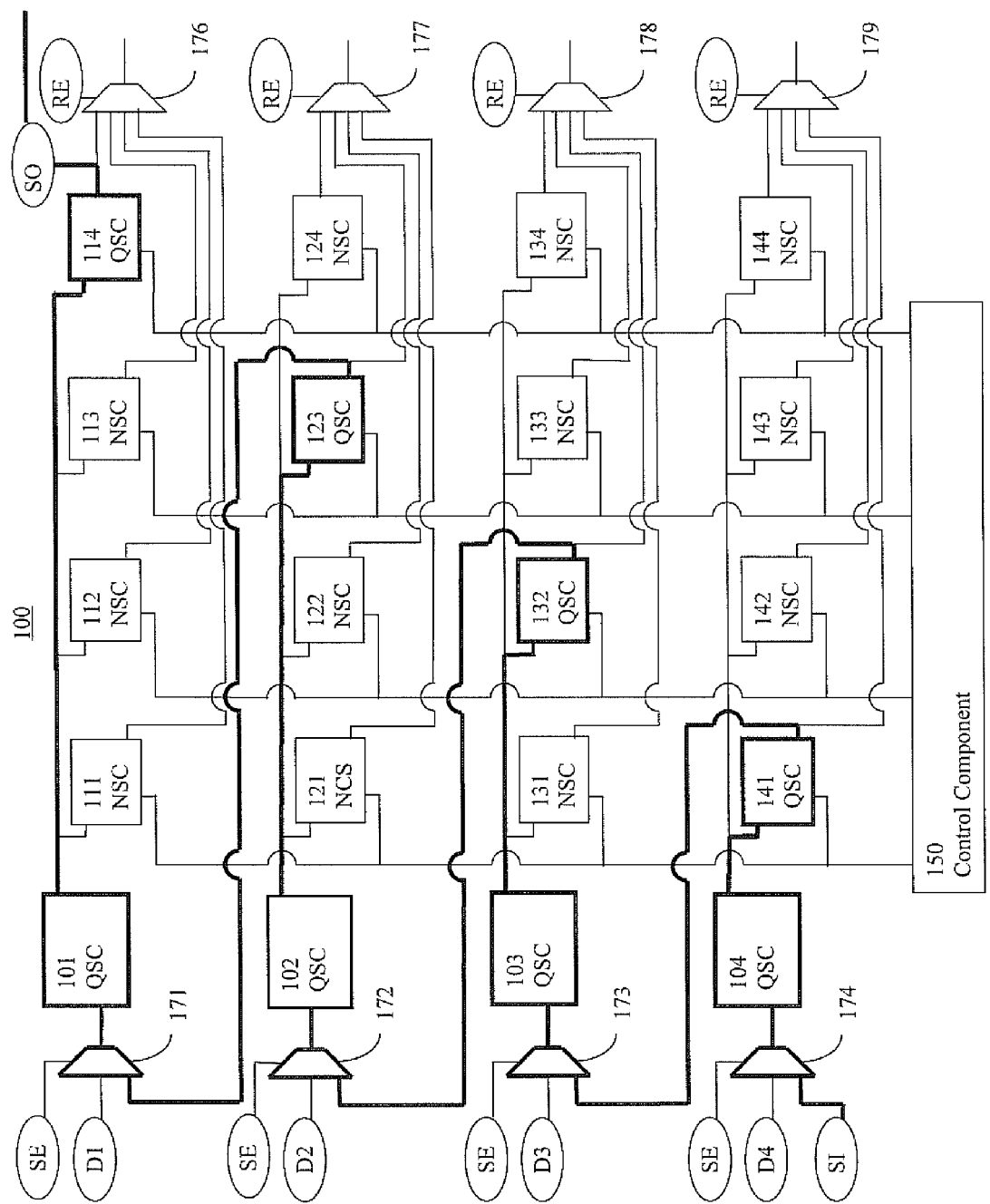
FIG. 2 is a block diagram of the exemplary scan system with a scan path high lighted in accordance with one embodiment of the present invention.

FIG. 2 is a block diagram of the of exemplary scan system 100 with a scan path highlighted in accordance with one embodiment of the present invention. As show in FIG. 2, when the scan enables are activated a scan path is formed and scan information flows from the scan input (SI) at input interface selection component 174 through the input interface selection components 174-171 and diagonally configured or arranged array quasi-scannable components 141, 132, 123, and 114, which can be selectively configured or included in constructed scan components SC1, SC2, SC3, SC4 respectively. It is appreciated that the scan input can flow to any of the scannable components in accordance with scan controls, after which operations can be performed on the scan input, a resulting value can be captured, and the captured valued can be by the scannable component communicated out of the array (e.g., by scan out SO, etc.) in accordance with scan controls.

It is appreciated that array scannable components can include various components (e.g., state elements, flops, latches, array cells, storage elements, etc).

FIG. 3 is a block flow chart of exemplary array scan formation method 300 in accordance with one embodiment of the present invention.

In block 310, an array input interface is formed. In one embodiment, the array input interface includes an input interface selection component communicatively coupled to an input interface scannable component. In one exemplary implementation, the input interface selection component is a multiplexer with at least one data input and at least one scan input. The select signal of the multiplexer is communicatively coupled to a scan enable. The output of the multiplexer is communicatively coupled to the input interface scannable component. In one exemplary implementation, the input interface quasi-scannable component is a low phase latch.

In block 320, an array is formed and communicatively coupled to the array input interface. In one embodiment, the array includes a plurality of quasi-scannable and non scannable components configured in array rows and columns with at least one of the plurality of quasi-scannable components in each column. At least one of the plurality of quasi-scannable components can also be included in each row. In one exemplary implementation, at least some of the quasi-scannable components are configured or oriented at least in part in a diagonal pattern in the array. In at least one row, the output of an array quasi-scannable component is communicatively coupled to a scan input of an input interface selection component associated with another row. In one embodiment, the inputs of each of the array quasi-scannable component and array non scannable components in a row are communicatively coupled in parallel to the outputs of the corresponding respective input interface scannable component from block 310. In one exemplary implementation, at least some of the quasi-scannable components and non scannable components in the array are high phase latches.

In block 330, an array output interface is formed and communicatively coupled to the array. In one embodiment, the array output interface includes an output interface selection component communicatively coupled to the array quasi-scannable component and array non scannable component for each respective row included in the array. In one exemplary implementation, the output interface selection component is a multiplexer. The select signal of the multiplexer is communicatively coupled to a read enable. In one exemplary implementation, the read enable is a read select such as a decoded read address.

Figure 4:
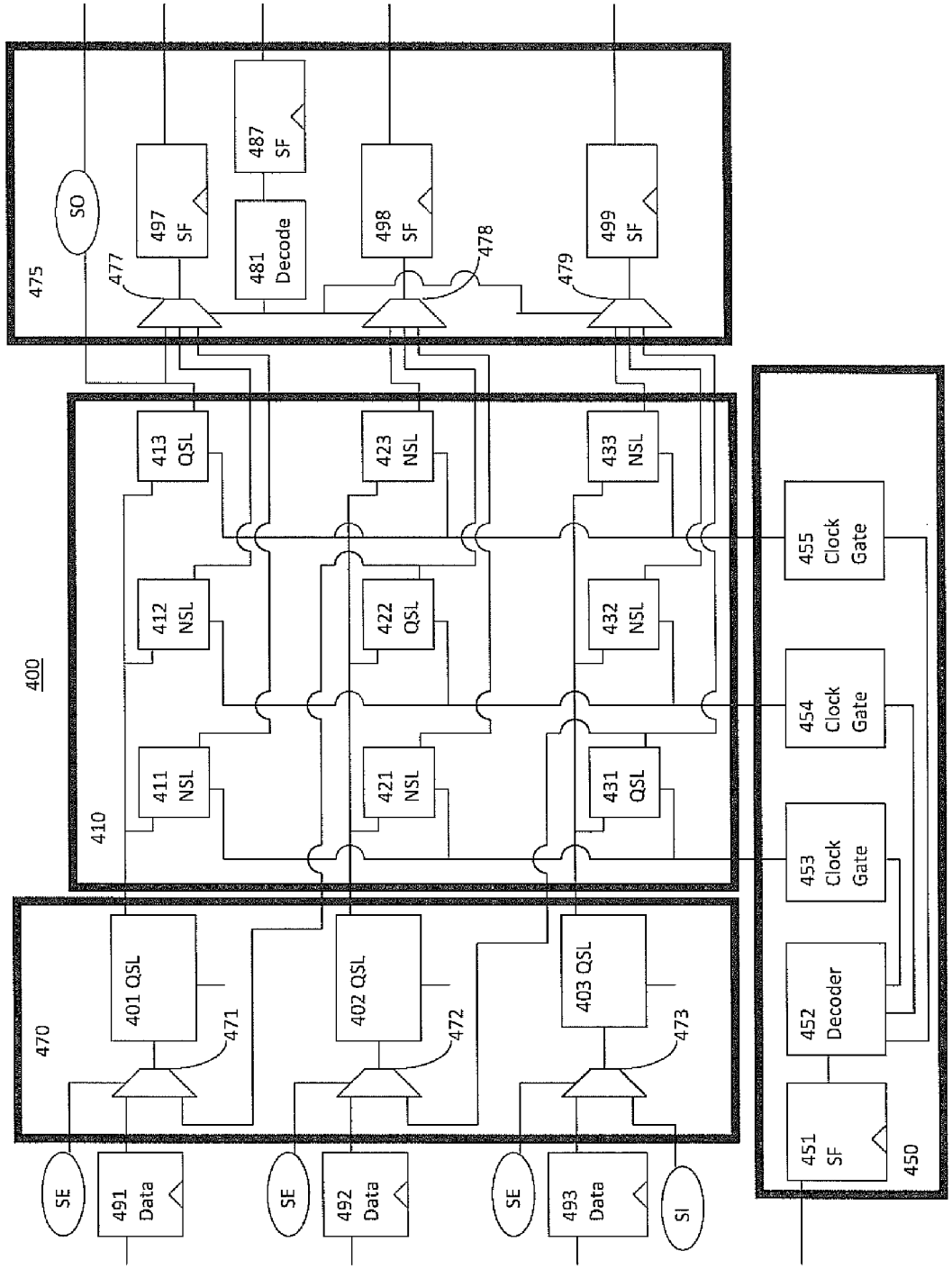
FIG. 4 is a block diagram of an exemplary scan system with diagonal scannable latches in accordance with one embodiment of the present invention.

FIG. 4 is a block diagram of exemplary scan system 400 with diagonal scannable latches in accordance with one embodiment of the present invention. Scan system 400 is similar to scan system 100 in which at least some of the scannable and non scannable components are latches. Scan system 400 includes array input interface component 470, array 410, array control component 450, and array output interface 475. Input interface component 470 includes input interface selection components 471-473 and input interface quasi-scannable latch components 401-403. Array 410 includes array quasi-scannable latch components 431, 422, and 413, and array non-scannable latch components 411, 412, 421, 423, 432 and 433. Control component 450 includes control scan flop 451, control decoder 452, and clock gates 453, 454, and 455. Output interface 475 includes output interface selection components 477-479, output scan flop 497-499, output interface decoder 481 and output scan flops 487. Scan system 400 can also comprise various other components including input scan flops 491-493. The components of scan system 400 are communicatively coupled as shown in the figure.

It is appreciated that the scannable and non scannable components can include a variety of components. In one embodiment, input interface quasi-scannable components 401-403 are low phase quasi-scannable latch components or phase 2 quasi-scannable latch components and array quasi-scannable components 431, 422, 413, are high phase quasi-scannable latch components or phase 1 scannable latch components.

In one embodiment, at least some of the components of scan system 400 are configured in an array. In one exemplary implementation the array includes rows and columns. A first row includes array quasi-scannable latch component 413 non-scannable latch components 411 and 412. A second row includes array quasi-scannable latch component 422 and non-scannable components 421 and 423. A third row includes quasi-scannable latch component 431 and non-scannable latch components 432 and 433. A first column includes quasi-scannable component 431 and non-scannable components 411 and 421. A second column includes quasi-scannable component 422 and non-scannable components 412, and 432. A third column includes quasi-scannable component 413 and non-scannable components 423 and 433. In one embodiment, quasi-scannable components 431, 422 and 413 are configured in a diagonal pattern in the array. Quasi-scannable components 431, 422 and 413 are selectively configured to participate in respective constructed scannable components. It is appreciated that in addition to the array components, other components including the optional components can be associated with rows and columns of the array as shown in the FIG. 4.

The components of scan system 400 cooperatively operate to provide efficient scan testing. In one embodiment, some of the components of scan system 400 are included in a data path. The data path can be a structured data path. In one embodiment, input data is communicated through the structured data path. In one exemplary implementation, scan data can also be communicated through at least a portion of the structured data path.

In one embodiment, at least some of the scannable latch components form a diagonal pattern in the array. In one exemplary implementation, information can be communicated or forwarded from one scannable latch arrays in the diagonal pattern to another of the scannable latch arrays in the diagonal pattern via an input interface selection component. The respective input interface selection components select between respective input data and scan inputs. Some of the scan inputs are forwarded from outputs of other scannable components in the array. The output of quasi-scannable component 431 is forwarded to an input of input selection component 472. The output of quasi-scannable component 422 is forwarded to an input of input selection component 471.

The input selection components 471-473 select between respective a scan input and a data input. The outputs of selection components 471-473 are forwarded to input interface quasi-scannable components 401-403 respectively. The output of quasi-scannable components 401-403 is forwarded to non-scannable components and quasi-scannable components of array 410 in parallel as illustrated in the figure. The outputs of the scannable and non-scannable components in the array are forwarded to respective output selection components of output interface 475 as illustrated in the Figure.

Control component 450 includes control scan flop 451, control decoder 452, clock gate 453, clock gate 454 and clock gate 455. Control component 450 controls communication or the clocking of information through the array. In one embodiment, a clock gate is associated with a respective column of an array. In one embodiment control scan flop 451 is a scannable write flop and control decoder 452 is a write decoder that decodes a write address and control component 450 controls the clocking of the information through the array based upon write address information.

Output interface 475 includes output selection components 477-479, output scan flops 497-499, output decoders 481 and output decode scan flops 487. In one embodiment, output scan flops 497-499 are scannable read flops and the output decoder 481 is a read decoder that decodes a read address.

FIG. 5 is a block diagram of exemplary scan method 500 in accordance with one embodiment of the present invention.

In block 510, a scan configuration process is performed. In one embodiment, an input interface selection component is configured to select scan information. In one exemplary implementation, an input interface selection component or multiplexer is configured to select scan information.

In block 520, the scan information is communicated to an array. In one embodiment, the array includes a plurality of quasi-scannable components and a plurality of non scannable components, wherein each column of the array includes at least one quasi-scannable component. The scannable components can include latches. In one embodiment, at least some of the quasi-scannable latch components and non scannable latch components are included in a data path. In one exemplary implementation, at least some of the quasi-scannable latch components form a diagonal pattern in the array. In one exemplary implementation, communicating the scan information includes a scan input enabling process comprising: receiving information regarding a selection between the data input and the scan input; and forwarding the data input or the scan input based upon the information regarding a selection between the data input and scan input.

In one exemplary implementation, selection of data or scan input is based upon the scan enable and communication of the information through the array is controlled by a clocking process.

In block 530, an information capture process is performed. It is appreciated that the present approach can be efficiently and flexibly implemented to capture various information. In one embodiment, the information capture process can capture information to and from various components. In one exemplary implementation, the capture process can include capturing information from at least one of a plurality of quasi-scannable components. The information capture process can include capturing information from at least one of a plurality of non-scannable components. The information capture process can include capturing information from a control component (e.g., clock gate, etc.). The capture process can include capturing information to at least one of a plurality of quasi-scannable components. In one exemplary implementation, the captured information includes information to at least one of the quasi-scannable components from a clock gate. In one exemplary implementation, the captured information includes information from at least one of the quasi-scannable components to an output scan flop. In one exemplary implementation, the captured information can include information from a data input.

Captured information can be utilized in a fault detection process and an observability process. The fault detection process can be directed to detecting faults associated with control components (e.g., decoder for the write addresses, clock gates, clock lines, etc.) involved in controlling at least a portion of an array.

The fault detection process can be directed to detecting faults associated with array input interface components, array components, and array output interface components.

In block 540, the information associated with capture process of block 530 is forwarded. In one embodiment, the information is forwarded through a scan path. In one embodiment, the information to and from at least one of the plurality of quasi-scannable latch components is forwarded through a multiplexer and at least one other of the plurality of quasi-scannable latches in another row of an array. In one exemplary implementation, the forwarding is controlled by a clocking process.

In one embodiment, a presented scan system the array elements which where non-scannable and created a sequential depth of "1" can be handled by ATPG tools with additional cost of extra patterns and run time compared to a full scan design. In one exemplary implementation, there is an addition of as little testability as possible to detect other of the faults without growing a latch array or having an adverse affect on timing. In one embodiment, the presented diagonal pattern array scannable component configuration is utilized to detect some faults on the decoders for write addresses, clock gates and clock lines that would otherwise be undetected.

In one embodiment, where there is at least one scan cell or quasi-scannable component in each column, quasi-scannable high phase latches in a diagonal pattern or fashion are utilized. The embodiment includes a multiplexer (MUX) in the data line of the low phase latch to select between scan in and data and wiring required to form the scan flops and switching. This can provide a scan flop in each column. The impact can be minimal on area and timing in one exemplary implementation, as the approach in the exemplary implementation only introduces a MUX on data of low phase latches and takes advantage of available tracks for creating the scan flops. These scan flops can also provide some help in making or converting some paths formerly having sequential depth of "1" to full scan, which is an added benefit. The presented diagonal scan approaches can show or provide an improvement in test coverage and fault detection over conventional approaches.

In one embodiment, from an ATPG perspective the design includes three rows and three columns of storage elements in which the relevant sequential points were similar to those shown in FIG. 4. In addition to ATPG, the presented diagonal scan approach can also contribute to resolving some of the diagnosibility issues of conventional latch arrays by providing one control and observation points on each row.

It is appreciated that there are various configurations of patterns with one scannable cell in each column. Making one high phase latch scannable in each column can grow the area. Putting all scanned high phase latches in the same row can increase the row numbers. In one embodiment, utilizing a quasi-scannable low phase latch and a quasi-scannable high phase latch in each row to form a scan flop (wherein at least some of the quasi-scannable high phase latches form a diagonal pattern in the array) can provide a testability solution that has reduced or no adverse affect on area and timing.

Figure 6:
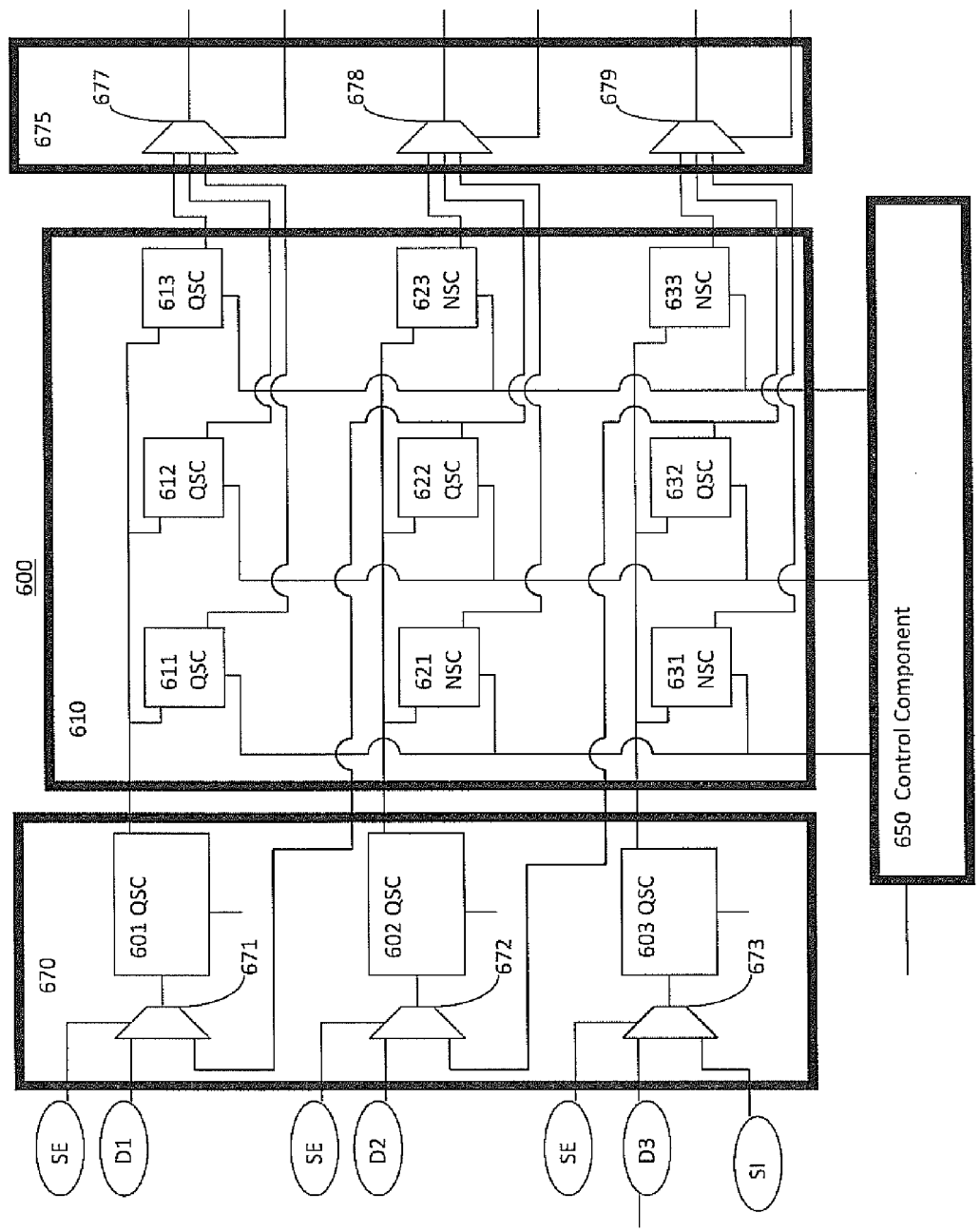
FIG. 6 is a block diagram of an exemplary scan system with horizontal and vertical scannable components in accordance with one embodiment of the present invention.

FIG. 6 is a block diagram of exemplary scan system 600 with horizontal and vertical scannable components in accordance with one embodiment of the present invention. Scan system 600 is similar to scan system 100 except at least some of the scannable components are in a horizontal scan path pattern and some are in a vertical scan path pattern. Scan system 600 includes array input interface component 670, array 610, array control component 650, and array output interface 675. Input interface component 670 includes input interface selection components 671-673 and input interface scannable components 601-603. Array 610 includes array scannable components 611, 612, 613, 622, and 632, and array non-scannable components, 621, 623, 631 and 633. Output interface 675 includes output interface read selection components 677-679. The components of scan system 600 are communicatively coupled as shown in the figure. It is appreciated that scan system 600 includes at least one array scannable component in each column (e.g., 611, 612, and 613) and at least one array scannable component in each row (e.g., 612, 613, 622, and 632). Scan information can be communicated or forwarded from array scannable components 622 and 632 via input interface selection components 671 and 672 respectively.

Figure 7:
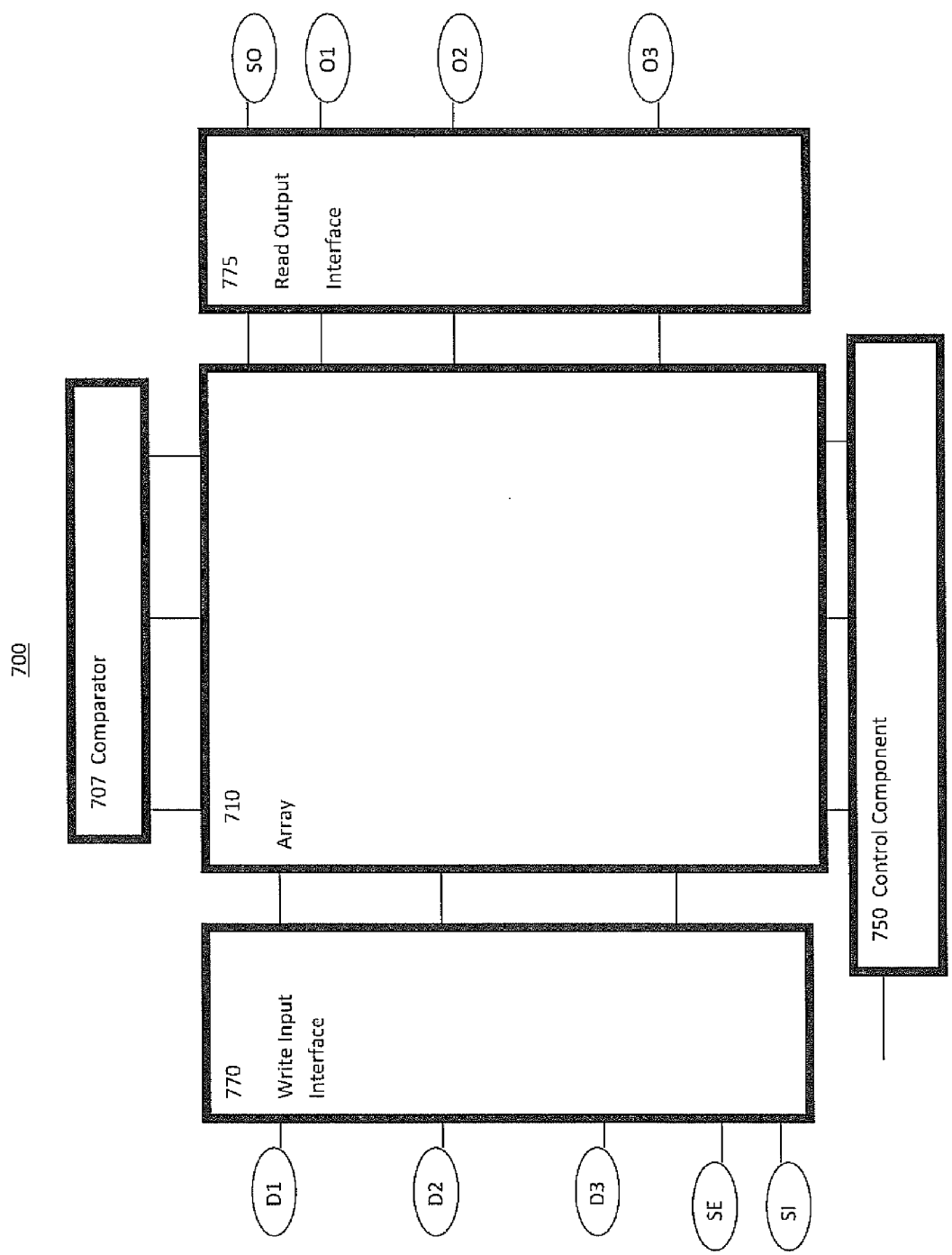
FIG. 7 is a block diagram of a scan system in a write/read/compare application in accordance with one embodiment of the present invention.

It is appreciated that the present invention can be implemented in a variety of embodiments. FIG. 7 is a block diagram of a scan system 700 in a write/read/compare application in accordance with one embodiment of the present invention. Scan system 700 includes write input interface component 770, array 710, array control component 750, comparator 707, and read output interface 775. Write input interface component 770 is an array input interface (e.g., similar to 170, 470, 670, etc.) that receives write data D1, D2 and D3. The write data D1, D2 and D3 can be write bit (0), write bit (1) and write bit (2) respectively in a data word. Array component 710 is an array with scan capability (e.g., similar to array 110, 410, 610, etc.). In one embodiment, array 710 includes scannable high phase latch components. Control component 750 controls or clocks information through array 710. Comparator 707 compares information. In one embodiment, comparator 707 performs a CAM compare. Read output interface component 775 is an array output interface (e.g., similar to 175, 475, 675, etc.) that receives read data from the array 710. The read data can be output as O1, O2 and O3. The output O1, O2 and O3 can be read bit (0), read bit (1) and read bit (2) respectively in a data word.

In one exemplary implementation the present invention can be utilized for scan testing of processing systems utilized to provide a variety of graphics applications (e.g., including video games, mobile applications, etc.). For example, the present invention can be utilized for scan operations in a game console, personal computer, personal digital assistant, cell phone or any number of platforms for implementing a video game and mobile devices. It is also appreciated the present invention is not limited to these implementations.

Portions of the detailed description are presented and discussed in terms of a method. Although steps and sequencing thereof are disclosed in figures herein describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed within a computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "processing", "computing", "calculating", "determining", "displaying", "accessing," "writing," "including," "storing," "transmitting," "traversing," "associating," "identifying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Some embodiments may be described in the general context of computer-executable instructions, such as program modules, executed by one or more computers or other devices. Generally, program modules include routines, programs, objects, components, data structures, etc., that perform particular tasks or implement particular abstract data types. Typically the functionality of the program modules may be combined or distributed as desired in various embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A system comprising:
   an input interface including a plurality of multiplexers and a plurality of quasi-scannable second phase latches; and
   an array including a plurality of non scannable first phase latches and a plurality of quasi-scannable first phase latches, wherein the plurality of quasi-scannable first phase latches do not form scan flip flops individually by themselves but are selectively configured with respective ones of the plurality of multiplexers and respective ones of the plurality of quasi-scannable second phase latches to form respective constructed scannable flip flops, wherein:
      each column of the array includes at least one of the plurality of quasi-scannable first phase latches;
      each row of the array that includes at least one of the plurality quasi-scannable first phase latches also includes at least one of the plurality of non scannable latches;
      at least one of the plurality of quasi-scannable first phase latches latch regular data and communicates the regular data to an output interface as part of normal operations; and
      the at least one of the plurality of quasi-scannable first phase latches captures data and at least one of the plurality of quasi-scannable second phase latches shifts the captured data in at least one of the respective constructed scannable flip flops as part of scan test operations.

2. The system of claim 1 wherein at least one of the plurality of quasi scannable second phase latches is upstream with respect to at least one of the plurality of quasi scannable first phase latches when the at least one of the plurality of quasi scannable first phase latches and the at least one of the quasi scannable second phase latches are selectively configured together as a constructed scannable flip flop.

3. The system of claim 1 wherein an output of the at least one multiplexer is communicatively coupled to an input of the at least one quasi-scannable second phase latch associated with one row; and an input of the at least one multiplexer is communicatively coupled to an output of the at least one quasi-scannable first phase latch associated with another row, wherein the at least one quasi-scannable second phase latch in each row drives the at least one of the plurality of quasi-scannable first phase latches in each row.

4. The system of claim 1 further comprising a clocking component that clocks the plurality of quasi-scannable first phase latches and the plurality of non scannable first phase latches included in the array.

5. The system of claim 4 wherein the clocking component includes:
   a clock gate element that clocks the at least one of the plurality of quasi-scannable first phase latches included in a column; and a control decoder that decodes information and selectively forwards an enable to the clock gate element.

6. The system of claim 1 wherein the at least one multiplexer, the at least one quasi-scannable second phase latch, and the at least one of the plurality of quasi-scannable first phase latches are included in a scan path.

7. The system of claim 1 wherein the at least one multiplexer, the at least one quasi-scannable second phase latch and the at least one of the plurality of quasi-scannable first phase latches form a scan flop.

8. A scan method comprising:
performing a scan configuration process in which an input interface selection component including a multiplexer is configured to select scan information;
communicating the scan information via a selectable scan chain path of an array, wherein the array includes a plurality of quasi-scannable latch components and a plurality of non scannable latch components, wherein each column of the array includes at least one quasi-scannable latch component that is selectively combined with other components to form a constructed scannable component, the plurality of quasi-scannable latch components forming a diagonal pattern through rows and columns of the array and selectable diagonal scan chain path in at least a portion of the array;
latching information in at least one of the plurality of quasi-scannable latch components and communicating the information to an output interface as part of normal operations; and
capturing information by the least one of the plurality of quasi-scannable latch components and forwarding the captured information as part of scan test operations.

9. A scan method of claim 8 further comprising capturing information from at least one of the plurality of quasi-scannable latch components.

10. A scan method of claim 9 wherein the communicating the scan information includes a scan input enabling process comprising:
receiving information regarding a selection between data input and scan input; and
forwarding the scan input based upon the information regarding a selection between the data input and scan input and wherein the scan input is forwarded to least one of the plurality of quasi-scannable latch components through a multiplexer and at least one other of the plurality of quasi-scannable latches.

11. A scan method of claim 8 wherein at least some of the quasi-scannable latch components and non scannable latch components are included in a data path.

12. A scan method of claim 8 wherein the forwarding is controlled by a clocking process and the capturing information includes capturing information associated with the clocking process.

13. A system comprising:
an array including a plurality of array non scannable components and a plurality of array quasi-scannable components, wherein each column of the array includes at least one of the plurality array quasi-scannable components that participates in normal operations during a non-scan mode and is selectively combined with other components to form a constructed scannable component that participates in scan operations during scan mode, the plurality of array quasi-scannable components forming a diagonal pattern through rows and columns of the array and selectable diagonal scan chain path in at least a portion of the plurality of array quasi-scannable components, wherein:
at least one of the plurality of quasi-scannable components stores regular data and communicates the regular data to an output interface as part of normal operations; and
the at least one of the plurality of quasi-scannable components captures data and shifts the captured data as part of scan test operations; and
an input interface configured to receive and selectively forward data and scan information to at least a portion of the array.

14. The system of claim 13 wherein at least one of the plurality of array quasi-scannable components includes a state element.

15. The system of claim 13 wherein the input interface includes:
an input interface quasi-scannable component associated with one row; and
an input interface selection component wherein an output of the input interface selection component is communicatively coupled to an input of the input interface quasi-scannable component and an input of the input interface selection component is communicatively coupled to an output of one of the plurality of array quasi-scannable components associated with another row.

16. The system of claim 15 wherein the input interface selection component includes a multiplexer, at least one of the array quasi-scannable components includes a high phase latch and the input interface quasi-scannable component includes a low phase latch; wherein an output of the high phase latch is communicatively coupled to an input of the multiplexer and the output of the multiplexer is communicatively coupled to an input of a low phase latch.

17. The system of claim 15 wherein the input interface quasi-scannable component drives the array quasi-scannable component.

18. The system of claim 13 further comprising a control component communicatively coupled to at least one of the plurality of array non scannable components and at least one of the plurality of array quasi-scannable components.

* * * * *